United States Patent [19]
Bertin et al.

[11] Patent Number: 5,604,755
[45] Date of Patent: Feb. 18, 1997

[54] MEMORY SYSTEM RESET CIRCUIT

[75] Inventors: Claude L. Bertin, S. Burlington; Charles E. Drake; John A. Fifield, both of Underhill; Erik Hedberg, Essex Junction, all of Vt.

[73] Assignee: International Business Machine Corp., Armonk, N.Y.

[21] Appl. No.: 565,627

[22] Filed: Nov. 20, 1995

[51] Int. Cl.$^6$ ........................................... G06F 11/00
[52] U.S. Cl. ............................. 371/48; 371/40.2
[58] Field of Search ............ 371/48, 49.1, 49.2, 371/40.1, 40.2

[56] References Cited

U.S. PATENT DOCUMENTS

| | | | |
|---|---|---|---|
| 4,031,374 | 6/1977 | Groudan et al. | 235/153 AM |
| 4,199,810 | 4/1980 | Gunckel, II et al. | 364/200 |
| 4,506,362 | 3/1985 | Morley | 371/13 |
| 4,653,050 | 3/1987 | Vaillancourt | 371/10 |
| 5,022,027 | 6/1991 | Rosario | 371/12 |
| 5,067,106 | 11/1991 | Pedersen et al. | 395/575 |
| 5,307,356 | 4/1994 | Fifield | 371/40.1 |
| 5,533,036 | 7/1996 | Blake et al. | 371/40.1 |

*Primary Examiner*—Vincent P. Canney
*Attorney, Agent, or Firm*—Thornton & Thornton; David R. Thornton; Eugene Shkurko

[57] ABSTRACT

A reset circuit for resetting a memory system following a radiation event includes an error detect circuit for producing an error signal in response to detection of an uncorrectable error in the systems memory arrays, and includes a control circuit for selectively resetting at least select portions of the memory system in response to the error detect signal. All or portions of the memory arrays can be reset by the control circuit, and complete or selective latch reset, or selective power recycling are provided. In one embodiment, the control circuit provides latch reset in response to the error detect signal so as to reset the memory latches without recycling power, and in another embodiment, the control circuit selectively cycles power to independent memory zones of the system to reset only those zones whose memory array is identified as having an uncorrectable error. Preferably, the control circuit, and perhaps the detect circuit, are radiation hardened to further ensure dependable operation of the reset circuit following a radiation event.

14 Claims, 2 Drawing Sheets

MEMORY SYSTEM RESET CIRCUIT

FIELD OF THE INVENTION

The invention relates to memory systems and more particularly to electronic circuits for resetting dynamic random access memory systems after disturbance by radiation.

BACKGROUND OF THE INVENTION

In data storage or memory systems utilizing random access memory circuits, known as RAMs and in dynamic random access memory circuits, or DRAMs, ionizing radiation can easily disrupt the small capacitance of elements of these circuits. Hence, such circuits are particularly susceptible to radiation induced errors and thus, can be unreliable in such an environment. Some of the changes in the logical value of a memory cell or element in these memory circuits can be corrected by well known methods such as by utilizing error correcting codes, (ECC). Consequently, electronic correcting circuits, or so called ECC circuits which utilize these correcting codes, are conventionally provided in conjunction with DRAM arrays.

Errors in these memory circuits are often defined as either soft or hard; with a soft error being a random, non-recurring, single bit error, and a hard error being defined as a fixed, recurring error. Commonly, the ECC circuit may be operable during refresh cycles, and a soft error is corrected by the ECC circuit employing error correction codes and standard technology to utilize redundant elements in lieu of the failed elements. On the other hand, when a hard error is detected by the ECC circuit, the latter produces an uncorrectable error signal, or UE signal, which indicates that the memory is faulty.

Hard errors occur in the manufacture of memory arrays, such that a steering or ordering strategy is generally provided for such arrays to select redundant memory cells, or groups, as replacements for inadequate elements. The ordering information is provided within a fuse array for permanent storage, and in turn, is transferred to a set of latches each time power is applied to the data storage circuit. Stated otherwise, each time the system power is cycled, the data storage system is reset in a conventional set/clear manner with a predetermined steering strategy in accordance with the preset latches.

Consequently, a common arrangement for resolving an uncorrectable error in these memory circuits, is to recycle the system power to thereby provide a set/clear signal to the system. Such power cycling, however, disturbs the overall system, consumes additional power and also results in a loss of data. Hence, it is quite unacceptable in many areas, such as in aerospace applications.

One solution is to radiation harden the data storage circuit as, for example, by encasing at least major portions of the system in a radiation resistant protective shield. As is self evident, however, such shielding requires added bulk, weight and expense to the circuits so as to often be impractical, particularly for aerospace applications. Examples of such protective shields are found in U.S. Pat. No. 5,067,106 which describes the use of a radiation detector coupled with a hardened delay circuit to ensure that writing to storage devices does not occur until after effects of a radiation event have passed, and in U.S. Pat. No. 4,199,810 which describes the use of a hardened memory unit to back up microprocessor instruction performance. Additionally, U.S. Pat. No. 5,052,027, discloses providing a radiation detector coupled with a radiation hardened memory to protect a microprocessor that is not radiation hardened.

Alternatively, other circuit arrangements are provided in the prior art to mitigate the damaging effects of radiation. For example, U.S. Pat. No. 4,506,362 teaches the use of error correction codes for correcting soft errors in DRAM circuits during refresh, and also alleviates correctable errors by replacement of each failing component with a spare component. U.S. Pat. No. 4,031,374 also corrects potential errors by ECC, and further teaches the use of a radiation detector coupled with current limiting circuitry to protect primary magnetic core or wire plate memory from overloads. Further, U.S. Pat. No. 4,653,050 describes a memory system having multiple memory modules, assigned or reassigned to obviate fault conditions.

While each of the above arrangements have select advantages, they generally involve considerable complexity and cost to the circuit as well as added weight. Hence, it is desirable to provide a simple, efficient solution to disturbance from a radiation event while minimizing memory loss without recycling power to the overall system.

SUMMARY OF THE INVENTION

One advantage of the present invention is to provide a reset circuit providing reset of a data storage circuit without recycling system power.

Another advantage of the present invention to provide a radiation hardened circuit section controlling non-radiation hardened memory circuits.

Still another advantage of the present invention to provide a novel circuit arrangement which directly resets the latch arrangements of a memory circuit responsive to a radiation event.

A still further advantage of the invention to provide a reset circuit for recycling power voltage to select zones of a memory circuit responsive to the production of an uncorrectable error in such zones.

These desirable results and other advantages of the invention are provided in a memory system having a RAM or DRAM circuit and including a reset circuit in which a control circuit resets select portions of the memory system in response to a radiation event, while maximizing the retention of stored data. In the preferred embodiments, an error detect signal arises from detection of an uncorrectable error in the memory arrays of a RAM memory system. In one embodiment, a control circuit directly resets the circuit latches to reorder one or more of the memory arrays without power cycling in response to the error detect signal. In a different embodiment, an error signal is independently provided for select circuit zones when the zone has an uncorrectable error, and the power is then recycled by the control circuit to those zones so as to automatically reset them. In the latter embodiment, the error signal may be provided for each RAM or DRAM memory chip having an uncorrectable error, and the power recycled in only failing chips thereby preserving operation of other circuit chips in the system. In any of the embodiments, the control circuit may be radiation hardened to further enhance the reliability of circuit operation in a radiation environment.

DESCRIPTION OF THE PREFERRED EMBODIMENT

Figure 1:
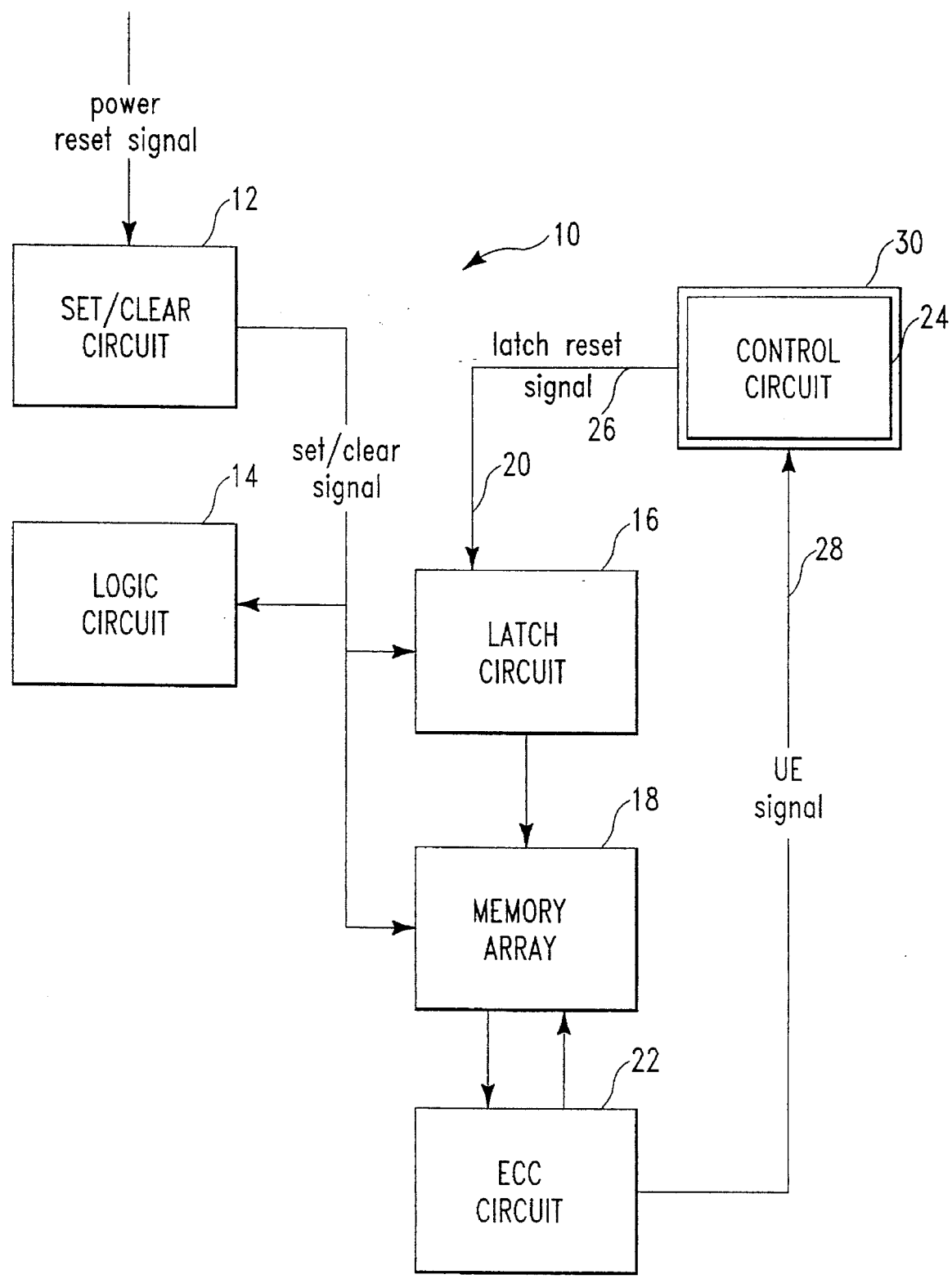
FIG. 1 is a diagrammatic block diagram of a DRAM circuit including a reset circuit providing automatic latch reset for faulty memory arrays following a radiation event in accordance with one preferred embodiment of the invention.

In FIG. 1, a random access memory system, such as a DRAM memory circuit 10 is illustrated as having a conventional set/clear circuit 12 for providing a set/clear signal to portions of the memory circuit 10, such as is illustrated, for example, to a logic circuit 14, a latch circuit 16 and a memory array 18. In a conventional manner, the set/clear circuit 12 produces a set/clear signal in response to a power reset signal or that is, a power off/on cycle of the memory circuit 10.

In this embodiment, the latch circuit 16 includes a novel terminal, or connector 20 for receiving a latch reset signal independent of the set/clear signal from circuit 12. However, it should be understood that the latter signals could utilize a common connector for latch reset in some circuit arrangements.

As illustrated in FIG. 1, an error detect circuit, such as an electronic correcting circuit, or ECC circuit 22 is connected to the memory array 18 to correct errors in, and disturbances of, the array in the usual manner. In this regard, the ECC circuit 22 will automatically rectify correctable errors, such as single bit errors, detected in the array 18 and produce an uncorrectable error signal, or UE signal, when a detected error is deemed uncorrectable. The UE signal, which is utilized in the preferred embodiments as an uncorrectable error detect signal, is delivered to a control circuit 24 through a connector designated at 28. The control circuit 24, in turn, provides a latch reset signal via the connector 20 to the latch circuit 16 to reset the latches for the memory array 18. Preferably, the latch circuit 16 at the very least includes the redundancy latches for the memory array 18, however, it may include both initialization and redundancy latches, such that both will be reset by the control circuit 24 following a radiation event.

Upon initial activation of the memory circuit 10, as it is powered up, the set/clear circuit 12 automatically resets pertinent circuit sections, such as the logic circuit 14, the latch circuit 16 and the memory array 18, as well as other portions (not shown) of the memory circuit 10. At this stage of the operation, the memory circuit 10 operates in a conventional manner to store data in the memory array 18.

Upon disturbance by radiation, the latch circuit 16 and the memory array 18 can be upset so as to no longer operate properly. That is, both hard and soft errors may occur in the memory array 18. Now at select times during circuit operation, such as during refresh cycles, the ECC circuit 22 interrogates the memory array 18 in a well known manner. If nothing has occurred to disturb the operation of the memory array 18, no further action is taken at that time by the ECC circuit 22. Upon disturbance of the memory circuit 10, however, such as from an occurrence of memory disturbing radiation, both hard and soft errors may be created in the memory array 18, and will be discovered by the ECC circuit 22 at its next interrogation of the array 18. At that time, the ECC circuit 22 will operate to correct any correctable errors in accordance with its error correcting codes, and to provide a UE signal for uncorrectable errors.

In the present invention, the UE signal is delivered, in turn, as an error detect signal to the control circuit 24. In response to this signal, the latter circuit automatically provides a latch reset signal through connector 20 to the latch circuit 16 to reset the circuit latches without cycling power to the system 10. Thus, it can be appreciated that the ECC circuit 22 provides means for detecting a radiation event and for delivering an error detect signal through connector 28 to the control circuit 24, and the latter, in turn, provides means for resetting at least a portion of the circuit latches in response to reception of that error signal.

Preferably, the control circuit 24 is shielded from radiation, or that is, radiation hardened, by means of a protective coating depicted at 30 by the outer of the lines defining the block for the control circuit 24 or fabricated in a radiation hardened technology. This radiation hardening of the control circuit 24 is accomplished with minimum cost and weight, and in combination with this circuit 24, further ensures proper operation of the DRAM memory circuit 10 following a radiation event.

The logic circuit 14 and the control circuit 24 are illustrated in FIG. 1, as separate circuit elements, however, the circuit functions of these units can be combined with, and provided within, a single logic circuit, not shown. Additionally, while the latch circuit 16, the memory array 18 and the ECC circuit 22 are all depicted as separate circuits, it should be understood that these are commonly included together on the same chip.

Any type of error detect circuit which will flag uncorrectable errors can be utilized in the preferred embodiments, and can be carried within, or in association with, various circuit sections, such as for example, the memory array 18 or the control circuit 24. It should also be noted that while an error detector is employed to trigger the control circuit 24, a radiation detector which directly senses a radiation event can also be utilized to trigger the control circuit into latch resetting operation. Furthermore, as noted previously, the latch circuit 16 in the above described embodiment, is specially designed to include a latch reset terminal, or connector 20, independent of the conventional power terminal so as to allow reset of the circuit latches independent of power recycling.

Figure 2:
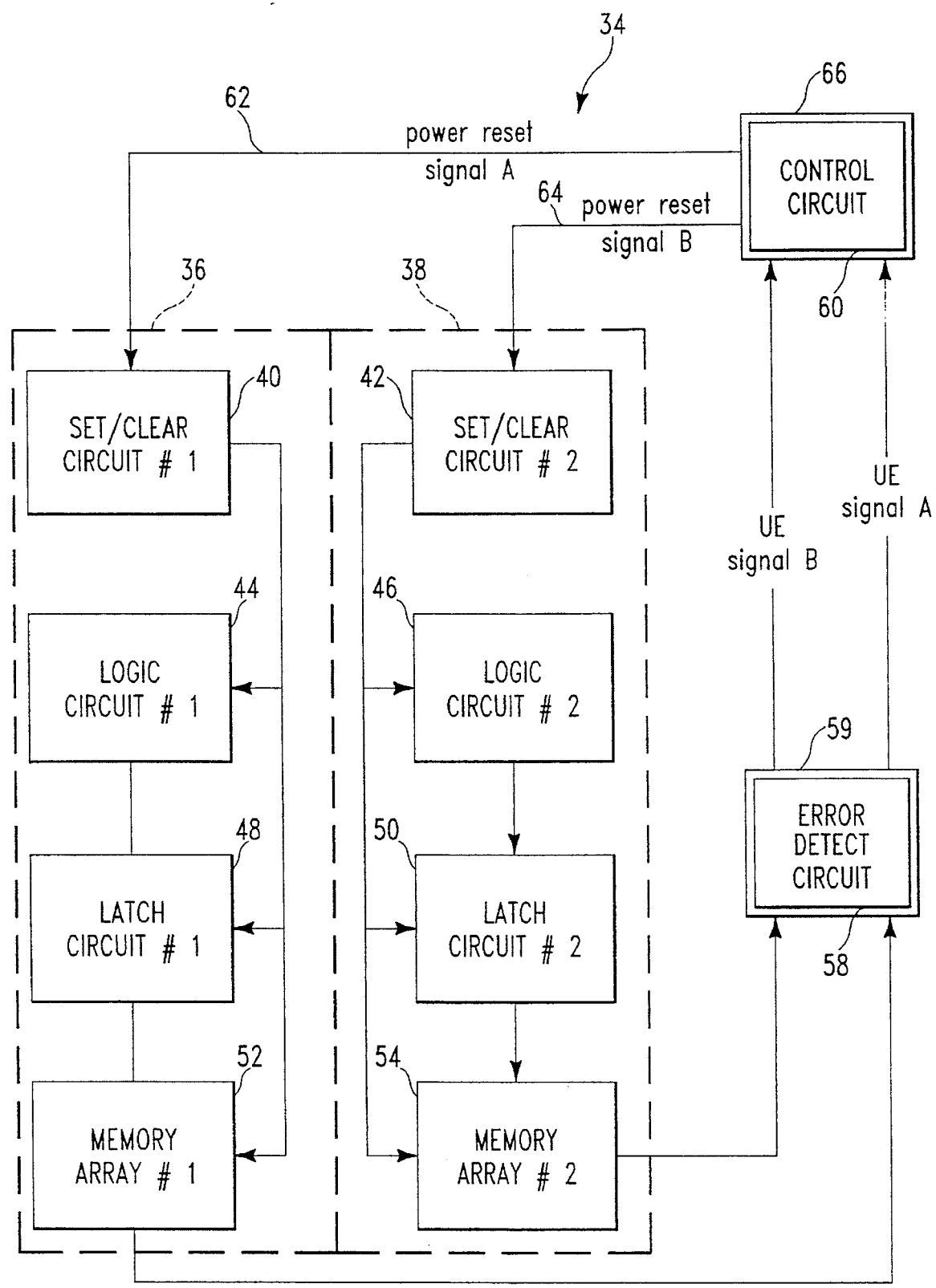
FIG. 2 is diagrammatic block diagram of an alternate embodiment illustrating a DRAM circuit including a reset circuit configured for power reset of select circuit zones in accordance with the invention.

Turning now to FIG. 2, a data storage circuit or memory system 34 is illustrated as comprising a pair of DRAM memory circuits 36 and 38, shown in dotted outline. For clarity of the description, only two memory circuits 36, 38 are shown, however, any number may be utilized. As illustrated, each of the memory circuits 36 and 38 are essentially identical to each other, and include set/clear circuits 40, 42, logic circuits 44, 46, latch circuits 48, 50 and memory arrays 52, 54, respectively.

Since this embodiment is directed to application of the invention to presently available chips, some of which do not provide an uncorrectable error flag, an error detect circuit 58 is coupled to the memory arrays 52 and 54 to evaluate each in a conventional manner for uncorrectable errors. Thus, the error detect circuit 58 can comprise a pair of ECC circuits for arrays 52 and 54, or a single ECC circuit alternately applied to either array. Hence, in a manner identical to the ECC circuit of FIG. 1, the error detect circuit 58 interrogates each of the arrays 52, 54 and produces an independent, uncorrectable error signal, or UE signal, for each array in a conventional manner. In this figure, the UE signal for the array 52 is designated as UE signal A and the signal for array 54 is designated as UE signal B. These UE signals A and B provide independent error detect signals to a control circuit 60 which, in turn, is constructed and arranged to independently recycle power to the circuits 36 or 38 in response to reception by the control circuit 60 of signals A or B, respectively. In effect, the control circuit 60 cycles the power off and then on to the circuits 36 and 38 in accordance with error signals A and B, respectively.

Stated otherwise, the power to either memory circuit 36 or 38 is cycled by means of the control circuit 60 when the memory arrays 52 or 54 exhibit an uncorrectable error, respectively. This is illustrated in FIG. 2 by delivery of independent power reset signals A and B from the control circuit 60 to the set/clear circuits 40 and 42, which resets these circuits 34, 36, including their latch circuits 48 and 50. Consequently, when either of the circuits 36, 38 are power reset, their latch circuits 48 and 50 will be reset accordingly to provide reordering of the arrays 52 and 54.

As previously indicated the data storage system 34 is constructed to accommodate available DRAM chips which are independently resetable by means of a power off/on cycle. Accordingly, in this embodiment the control circuit 60 regulates the power reset cycle of the independent circuit zones represented by the circuits 36 and 38. Hence, the power may be cycled for sections or zones of the storage circuit 34 without affecting power to other portions or zones of the circuit. Additionally, as described in regard to the embodiment of FIG. 1, the control circuit 60 is preferably radiation shielded, or hardened, as depicted at 66, by the outer line 66 of the circuit block 60 to ensure proper operation of the data storage circuit 34 following a radiation event. Similarly, error detect circuit 58 may be radiation shielded, or hardened, as shown in FIG. 2 by the outer line 59, to further ensure suitable operation.

As briefly noted previously, while only two memory circuits 34, 36, or that is only two circuit zones are illustrated in FIG. 2, any number of such circuit zones could be employed with each providing its own error signal by means of appropriate error detect circuits and with each being independently reset by the control circuit 60.

Either of the embodiments described above may be arranged in a variety of forms including that of an electronic module, such as in a cube configuration or multichip module, or a printed circuit board, such as a Simm. Additionally, both illustrated embodiments are suitable for reset of memory systems having multiple RAM circuits; with the embodiment of FIG. 1 resetting some, or all of the latches of all or select memory zones ot the system; and with the embodiment of FIG. 2 cycling the power to each such zone.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A reset circuit for resetting at least portions of a memory system including a RAM circuit having one or more circuit zones, each of which includes a redundancy memory array, said reset circuit comprising:
   a) an error detect circuit for producing an error signal in response to detection of an uncorrectable error in a respective circuit zone of said memory system; and
   b) a control circuit for resetting circuit zones of said memory system in response to an error signal associated with such circuit zone, and said control circuit being radiation hardened.

2. The circuit of claim 1 wherein each said circuit zone includes a plurality of latches configured for ordering the elements of its redundancy memory array, and said control circuit resets at least some of the latches of a given circuit zone without cycling power to said system in response to an error signal associated with that circuit zone.

3. The circuit of claim 1 wherein said reset circuit including said control circuits, and said error detection circuits and said memory system including its redundancy arrays are constructed within a multichip module.

4. The circuit of claim 1 wherein said reset circuit including said control circuits, and said error detection circuits and said memory system including its redundancy arrays are constructed within a single cube assembly.

5. The circuit of claim 1 wherein said reset circuit including said control circuit, and said error detection circuits and said memory system including its redundancy arrays are constructed within a single circuit board assembly.

6. The circuit of claim 1 wherein said memory system includes a plurality of said circuit zones, and said error detect circuit provides an independent error signal in response to detection of an uncorrectable error in a respective zone, and said control circuit provides an independent power reset signal to each given zone to reset it in response to an error signal for that respective zone so as to only recycle power to those zones having an uncorrectable error.

7. The circuit of claim 1 wherein each said circuit zone includes a plurality of redundancy latches configured for ordering the redundancy elements of its redundancy memory array, and said control circuit resets the redundancy latches of a given circuit zone without cycling power to said array in response to an error signal associated with that zone.

8. The circuit of claim 7 wherein each said circuit zone additionally includes initialization latches, and said control circuit resets the initialization and redundancy latches of a given zone in response to an error signal associated with that zone.

9. A reset circuit for resetting a memory system comprising at least one memory array having a plurality of redundancy elements, and a plurality of latches configured for ordering the elements of said one memory array, said reset circuit comprising:
   a) an error detect circuit for producing an error signal in response to detection of an uncorrectable error in an element of said one memory array; and
   b) a control circuit for resetting at least some of said latches in response to said error detect signal so as to reorder the elements of said array without cycling power to said array.

10. The circuit of claim 9 wherein said latches include redundancy latches and said control circuit provides a reset signal to reset said redundancy latches in response to said error detect signal without cycling power to said array.

11. The circuit of claim 10 wherein said latches also include initialization latches and said control circuit also resets said initialization latches in response to said error detect signal without cycling power to said array.

12. A reset circuit for resetting select portions of a memory system having one or more DRAM circuit zones, each of which include a redundancy memory array, said circuit providing a power reset connection for receiving a power reset signal; said reset circuit comprising;
   a) an error detect circuit for producing an independent error signal for each circuit zone in response to detection of an uncorrectable error in that respective zone; and b) a control circuit for independently resetting a given zone in response to an error detect signal for that zone to therefor only reset zones having an correctable error without resetting other error free zones.

13. The circuit of claim 12 wherein said control circuit resets a given zone by a power cycle of that zone in response to an error detect signal for that zone to therefor only reset power to zones having an uncorrectable error without recycling power to other error free zones.

14. The circuit of claim 12 wherein said memory system includes a plurality of said circuit zones and said error detect circuits produce an independent error signal for each of said circuit zones in response to an uncorrectable error therein, and said control circuit automatically cycles power to each given circuit zone in response to an error detect signal for that zone.

* * * * *